(12) United States Patent
Kim (10) Patent No.: US 7,344,941 B2
(45) Date of Patent: Mar. 18, 2008

(54) METHODS OF MANUFACTURING A METAL-INSULATOR-METAL CAPACITOR

(75) Inventor: Jung-Gyu Kim, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 111 days.

(21) Appl. No.: 11/314,293

(22) Filed: Dec. 21, 2005

(65) Prior Publication Data

US 2006/0134879 A1    Jun. 22, 2006

(30) Foreign Application Priority Data

Dec. 22, 2004    (KR) ...................... 10-2004-0110632

(51) Int. Cl.
*H01L 21/8242*    (2006.01)

(52) U.S. Cl. ...................... 438/253; 438/239; 438/240; 438/393; 438/396

(58) Field of Classification Search ................ 438/240, 438/250, 253, 393, 396, FOR. 220, FOR. 430, 438/239
See application file for complete search history.

(56) References Cited

U.S. PATENT DOCUMENTS

| | | | |
|---|---|---|---|
| 6,458,650 B1 * | 10/2002 | Huang et al. ................ | 438/253 |
| 2002/0019123 A1 * | 2/2002 | Ma et al. .................... | 438/622 |
| 2002/0163029 A1 * | 11/2002 | Dirnecker et al. .......... | 257/306 |
| 2004/0229457 A1 * | 11/2004 | Chan et al. ................. | 438/643 |
| 2005/0237441 A1 * | 10/2005 | Hotta et al. .................... | 349/43 |
| 2005/0287718 A1 * | 12/2005 | Berndlmaier et al. ....... | 438/149 |

* cited by examiner

*Primary Examiner*—George R. Fourson
*Assistant Examiner*—Joannie Adelle Garcia
(74) *Attorney, Agent, or Firm*—Andrew D. Fortney (57) ABSTRACT

Methods of manufacturing a metal-insulator-metal capacitor are provided. An illustrated method includes: forming a lower metal electrode layer pattern for a metal-insulator-metal capacitor and a lower metal line layer pattern for a metal line on a first insulating layer on a semiconductor substrate; forming a second insulating layer covering the lower metal electrode layer pattern and the lower metal line layer pattern on the first insulating layer; forming a trench penetrating the second insulating layer and exposing the lower metal electrode layer pattern; forming a dielectric layer on the second insulating layer and on an exposed surface of the lower metal electrode layer pattern; forming a first mask layer pattern on at least a portion of the dielectric layer within the trench and on an edge portion of the trench; forming a second mask layer pattern on the first mask layer pattern and the dielectric layer, the second mask layer pattern having an opening exposing at least a portion of the dielectric layer in the metal line region; forming a via hole penetrating the dielectric layer and the second insulating layer and exposing at least a portion of the lower metal line layer pattern using the second mask layer pattern; removing the second mask layer pattern and the first mask layer pattern; and forming an upper metal electrode layer for a metal-insulator-metal capacitor on a portion of the dielectric layer within the trench, and forming a via contact connected to the lower metal line layer pattern within the via hole.

16 Claims, 10 Drawing Sheets

METHODS OF MANUFACTURING A METAL-INSULATOR-METAL CAPACITOR

FIELD OF THE DISCLOSURE

The present disclosure relates generally to semiconductor fabrication, and, more particularly, to methods for manufacturing a metal-insulator-metal (hereinafter, referred to as MIM) capacitor.

BACKGROUND

FIG. 1 to FIG. 4 are cross-sectional views illustrating a conventional method of manufacturing a metal-insulator-metal capacitor.

Figure 1:
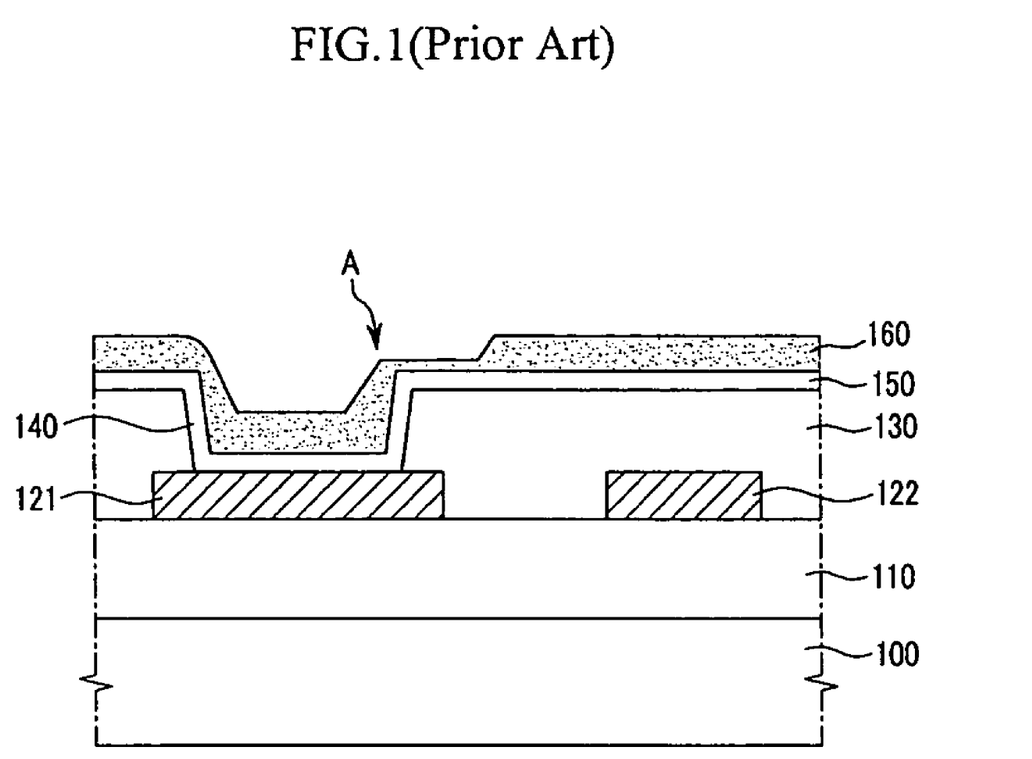
FIG. 1 to FIG. 4 are cross-sectional views illustrating a conventional method of manufacturing a metal-insulator-metal capacitor.

Referring to FIG. 1, a lower metal electrode layer pattern 121 for a MIM capacitor and a lower metal line layer pattern 122 for a metal line are respectively formed on an insulating layer 110 on a semiconductor substrate 100. The metal electrode layer pattern 121 and the lower metal line layer pattern 122 may be formed by performing predetermined patterning after depositing a metal layer. An insulating layer 130 is then formed. A trench 140 exposing the lower metal electrode layer pattern 121 in a MIM capacitor region is formed by an etching process using a predetermined mask layer pattern as an etching mask. Then, a dielectric layer 150 is formed over the entire upper surface of the resultant structure formed with the trench 140. A photoresist layer 160 is formed over the dielectric layer 150 to form an etching mask layer pattern for forming a via hole.

Figure 2:
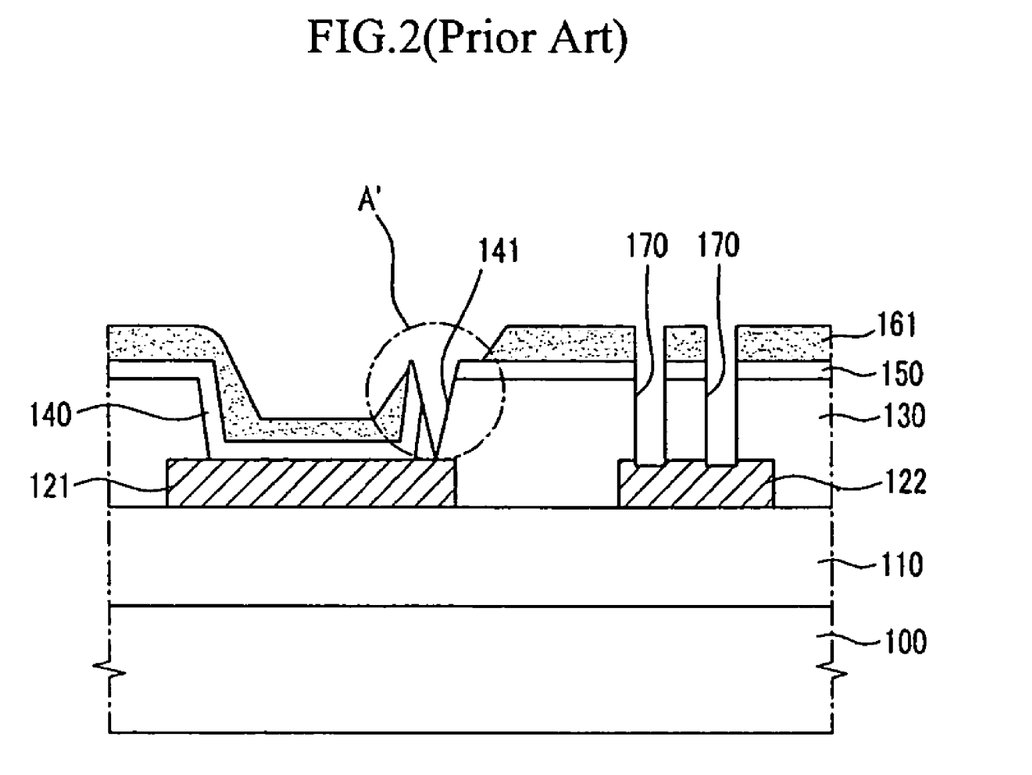

Next, referring to FIG. 2, a photoresist layer pattern 161 is formed exposing the dielectric layer 150 at a region where a via hole is to be formed by exposing and developing the photoresist layer indicated by reference numeral 160 in FIG. 1 using a conventional photolithography method. Then, a via hole 170 exposing the lower metal layer pattern 122 is formed by an etching process using the photoresist layer pattern 161 as an etching mask. After forming the via hole 170, the photoresist layer pattern 161 is removed.

Figure 3:
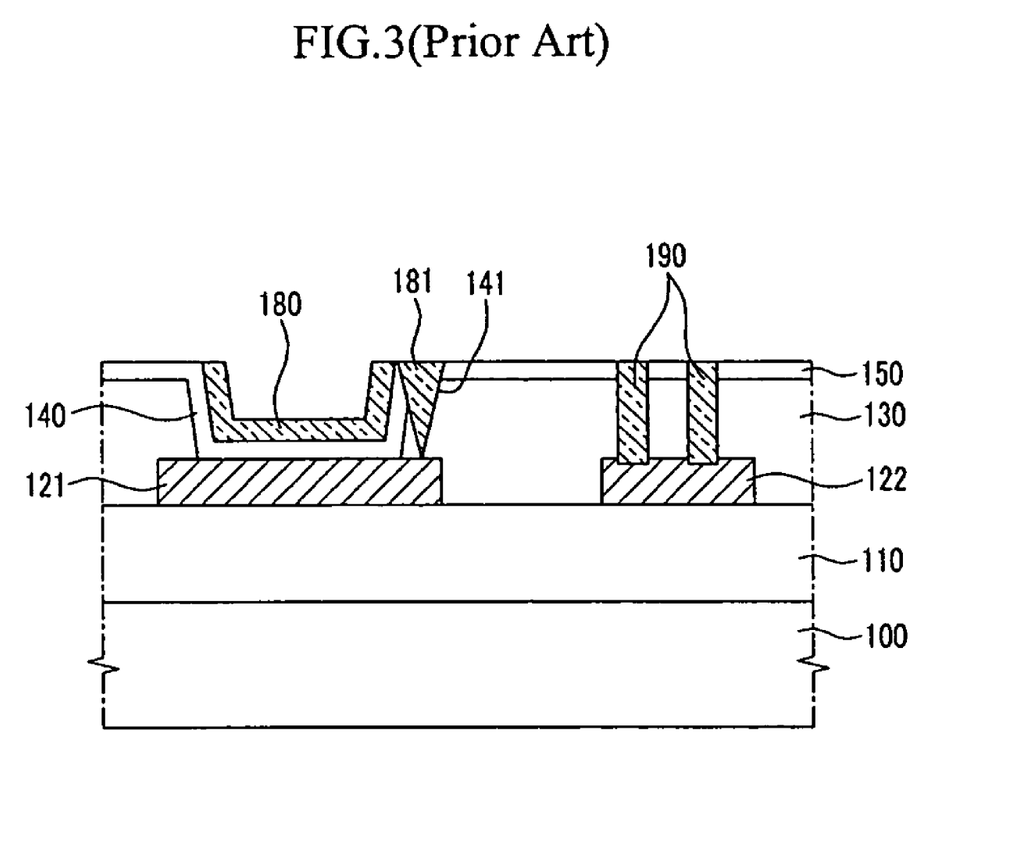

Then, referring to FIG. 3, after removing the photoresist layer pattern 161, a metal layer (not shown) such as a tungsten layer is formed over the entire upper surface of the resultant structure. In addition, a planarization process is performed such that a surface of the dielectric layer 150 is exposed, an upper metal electrode layer 180 is formed within the trench 140 in the MIM capacitor region, and a via contact 190 is formed within the via hole 170 in a metal line region.

Figure 4:
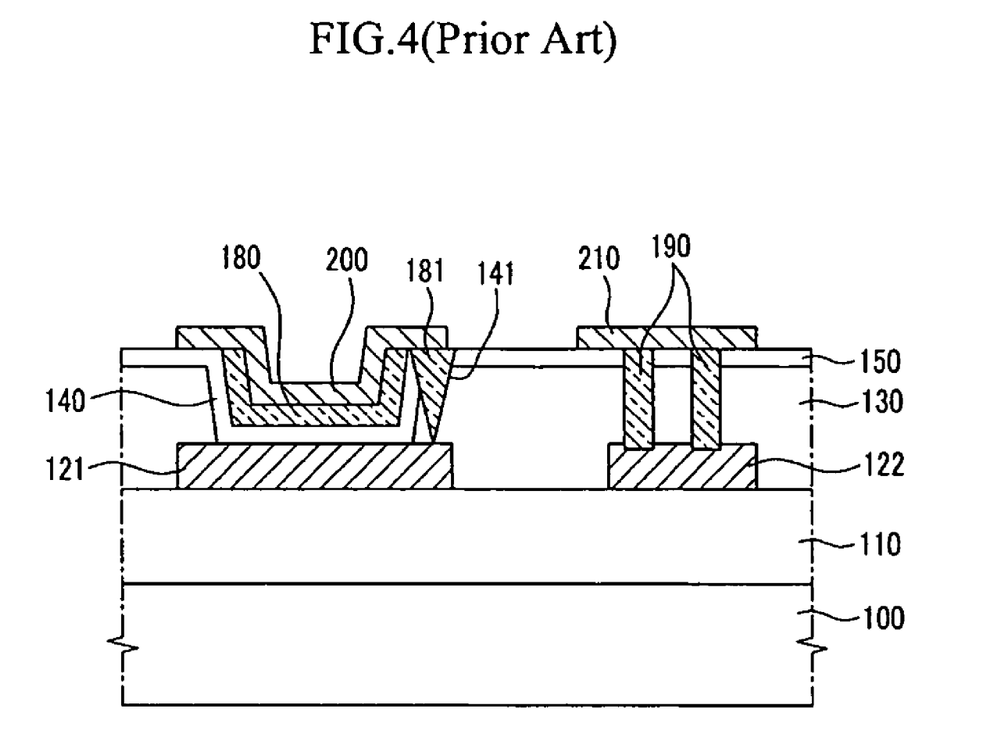

Then, referring to FIG. 4, by performing deposition and patterning of a metal layer, upper metal layer patterns 200 and 210 are formed, which are electrically connected to the upper metal electrode layer 180 in the MIM capacitor region and the via contact 190 in the metal line region, respectively.

However, such a conventional method of manufacturing the MIM capacitor may have the following problem. As shown in FIG. 1, in the process of forming the photoresist layer 160, a thickness of the photoresist layer pattern 160 at an upper edge portion A of the trench 140 may be relatively thinner than the thickness of the layer 160 at other portions. In such a case, as explained referring to FIG. 2, a portion of the photoresist layer pattern 161 near the upper edge portion A of the trench 140 may be removed by the etching process for forming the via hole 170, and thereby a groove 141 exposing the lower metal electrode layer pattern 121 may be formed. Then, as shown in FIG. 3, a metal layer 181 may be formed within the groove 141 in the subsequent process of forming a metal layer. The metal layer 181 is not removed by the subsequent planarization process, and, as shown in FIG. 4, it may be connected to the upper metal line layer 200. Consequently, the metal layer 181 may cause an electrical short between the lower metal electrode layer pattern 121 of the MIM capacitor and the upper metal electrode layer 180.

To clarify multiple layers and regions, the thickness of the layers are enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

FIG. 5 to FIG. 10 are cross-sectional views illustrating an example method of manufacturing a metal-insulator-metal capacitor performed in accordance with the teachings of the present invention.

Figure 5:
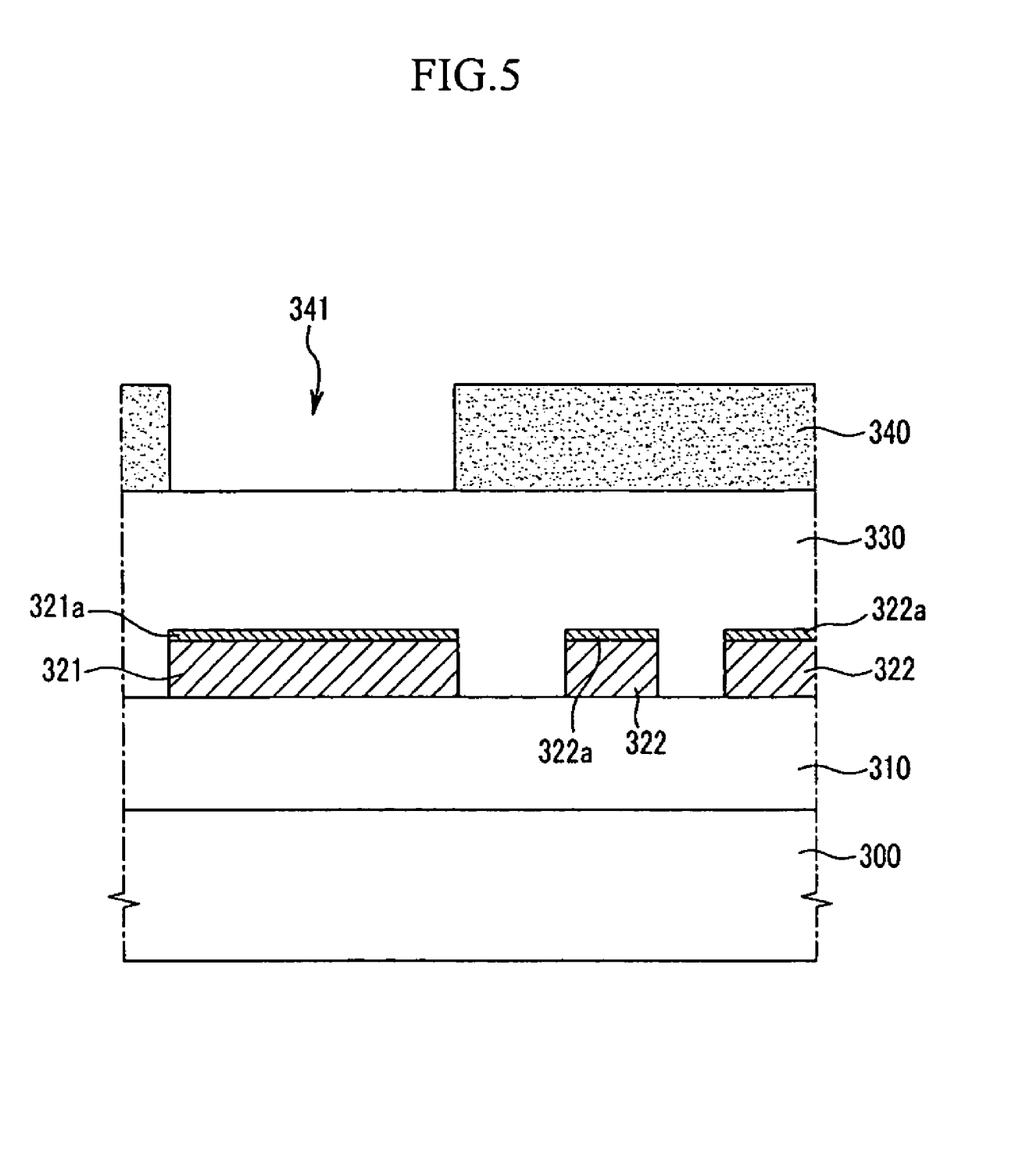
FIG. 5 to FIG. 10 are cross-sectional views illustrating an example method of manufacturing a metal-insulator-metal capacitor performed in accordance with the teachings of the present invention.

Referring to FIG. 5, a lower metal electrode layer pattern 321/321a for a MIM capacitor and a lower metal line layer pattern 322/322a for a metal line are respectively formed on an insulating layer 310 on a semiconductor substrate 300 such as a silicon substrate. Although not shown in the drawing, the lower metal electrode layer pattern 321/321a and the lower metal line layer pattern 322/322a may be electrically connected to a lower metal line layer (not shown). The lower metal electrode layer pattern 321/321a and the lower metal line layer pattern 322/322a may be formed as Al/TiN layers, Ti/Al/Ti/TiN layers or Ti/TiN/Al/TiN layers, but they are not limited thereto. In the drawing, an example structure is shown in which an Al layer 321 and a TiN layer 321a are sequentially accumulated. After forming the lower metal electrode layer pattern 321/321a and the lower metal line layer pattern 322/322a, a second insulating layer 330 is formed over the entire upper surface thereof. Subsequently, a first photoresist layer pattern 340 is formed on the second insulating layer 330 as a first mask layer pattern. The first photoresist layer pattern 340 includes an opening 341 exposing an upper surface of the second insulating layer 330 in a MIM capacitor forming region.

Figure 6:
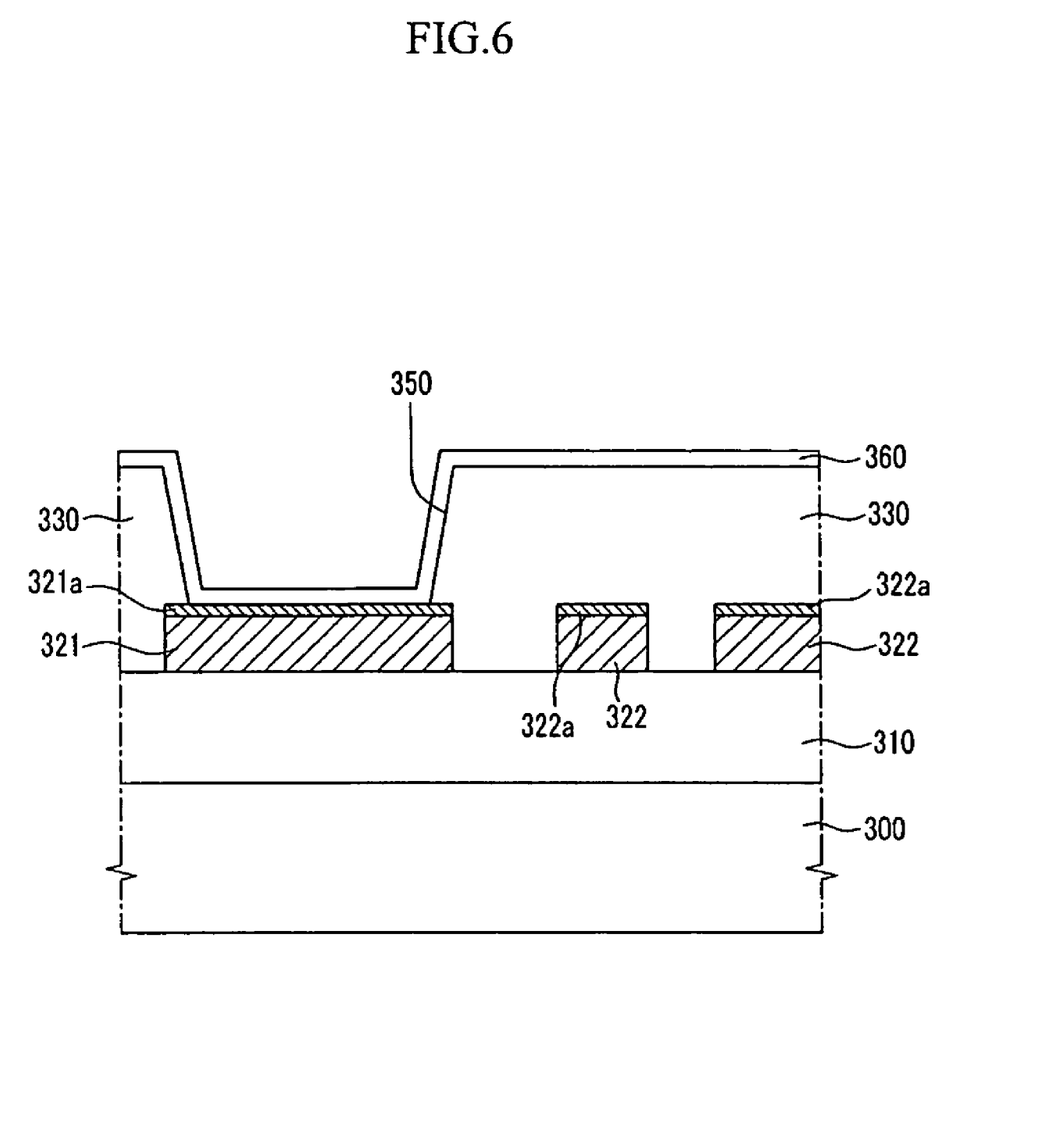

Then, referring to FIG. 6, a trench 350 penetrating the second insulating layer 330 and exposing the lower metal electrode layer pattern 321/321a of the MIM capacitor forming region is formed by performing an etching process using the first photoresist layer pattern indicated by reference numeral 340 in FIG. 5 as an etching mask. After forming the trench 350, the first photoresist layer pattern 340 is removed. For example, the first photoresist layer pattern 340 may be removed by performing a conventional ashing process. Subsequently, a dielectric layer 360 is formed over the second insulating layer 330 having the trench 350 and over a portion of the lower metal electrode layer pattern 321/321a exposed by the trench 350. The dielectric layer 360 may be a nitride layer.

Figure 7:
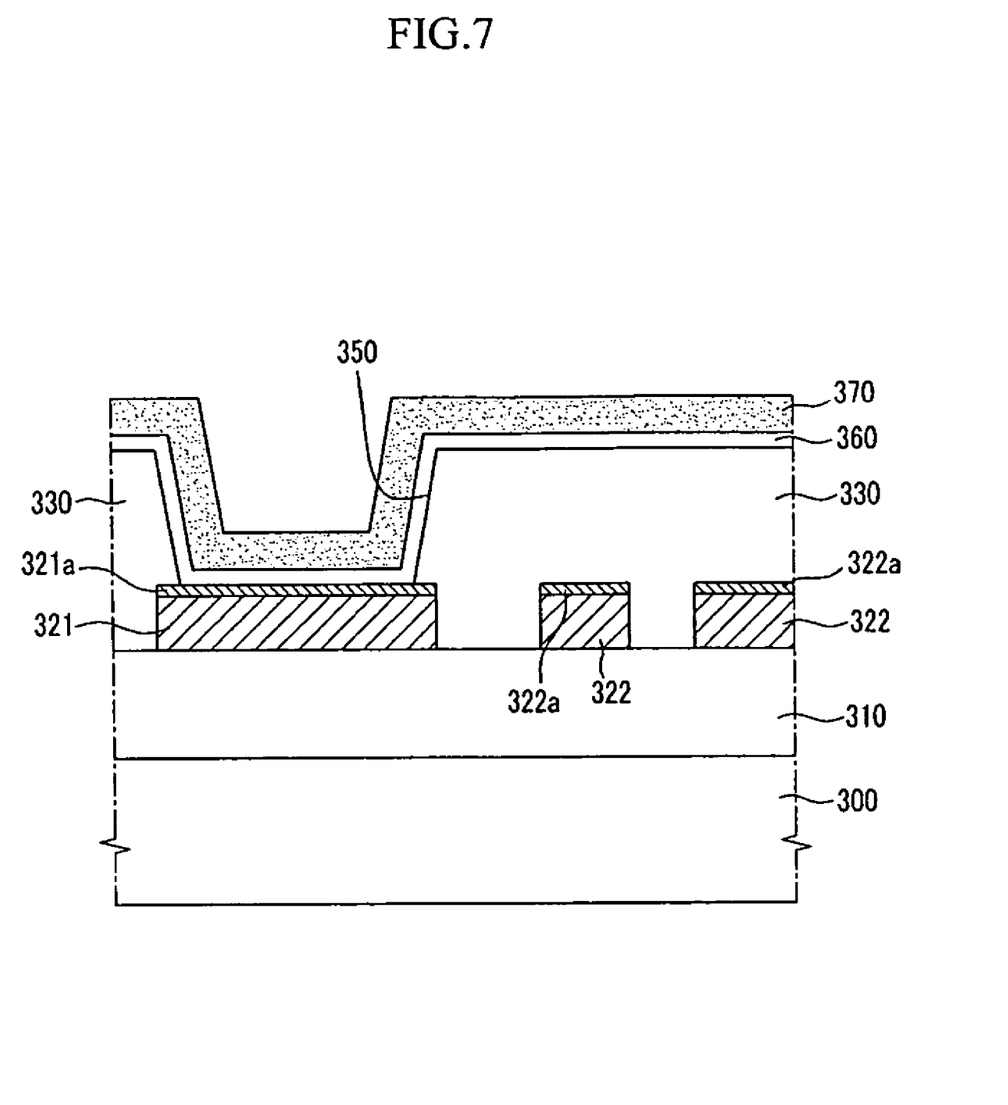

Referring to FIG. 7, a first mask layer 370 is formed on the dielectric layer 360. The first mask layer 370 may be formed as a photoresist layer. The first mask layer 370 may have a sufficient thickness at which an edge of the trench 350 can be maintained to be covered by the first mask layer 370 during a subsequent etching process for forming a via hole.

Figure 8:
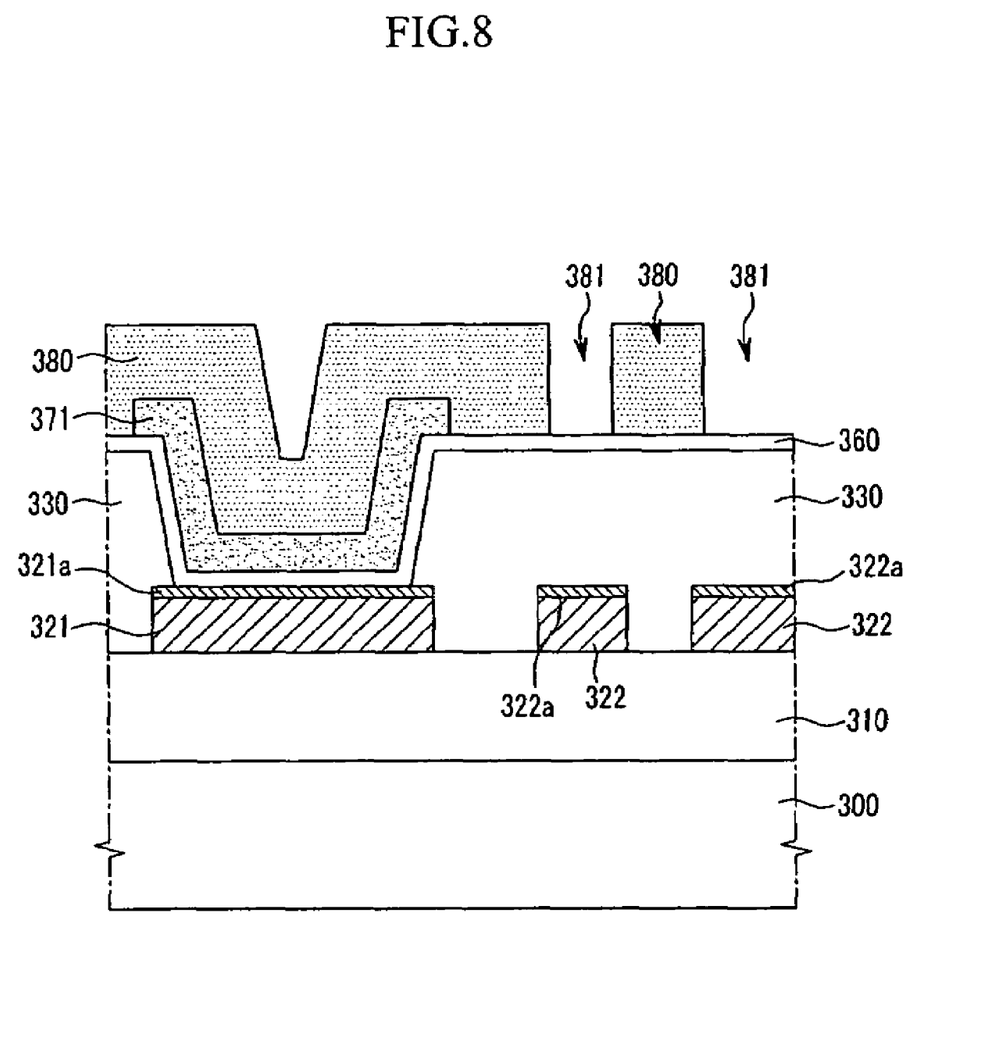

Referring to FIG. 8, a first mask layer pattern 371 covering the dielectric layer 360 within the trench 350 but exposing a portion of the dielectric layer 360 at a region of the metal line is formed as a reverse MIM pattern. In the illustrated example, the first mask layer pattern 371 is formed to cover an edge portion of the trench 350. As a result, the edge of the trench 350 is protected from being damaged by the etching process used to form the via hale. If the first mask layer 370 is formed as a photoresist layer, the first mask layer pattern 371 may be formed by performing exposing and developing processes using a conventional photolithography method.

Then, a second mask layer pattern 380 is formed on the first mask layer pattern 371 and on an exposed surface of the dielectric layer 360. The second mask layer pattern 380 may be formed as a photoresist layer. The second mask layer pattern 380 includes an opening 381 exposing the dielectric layer 360 at a via hole forming region for forming a metal line.

Figure 9:
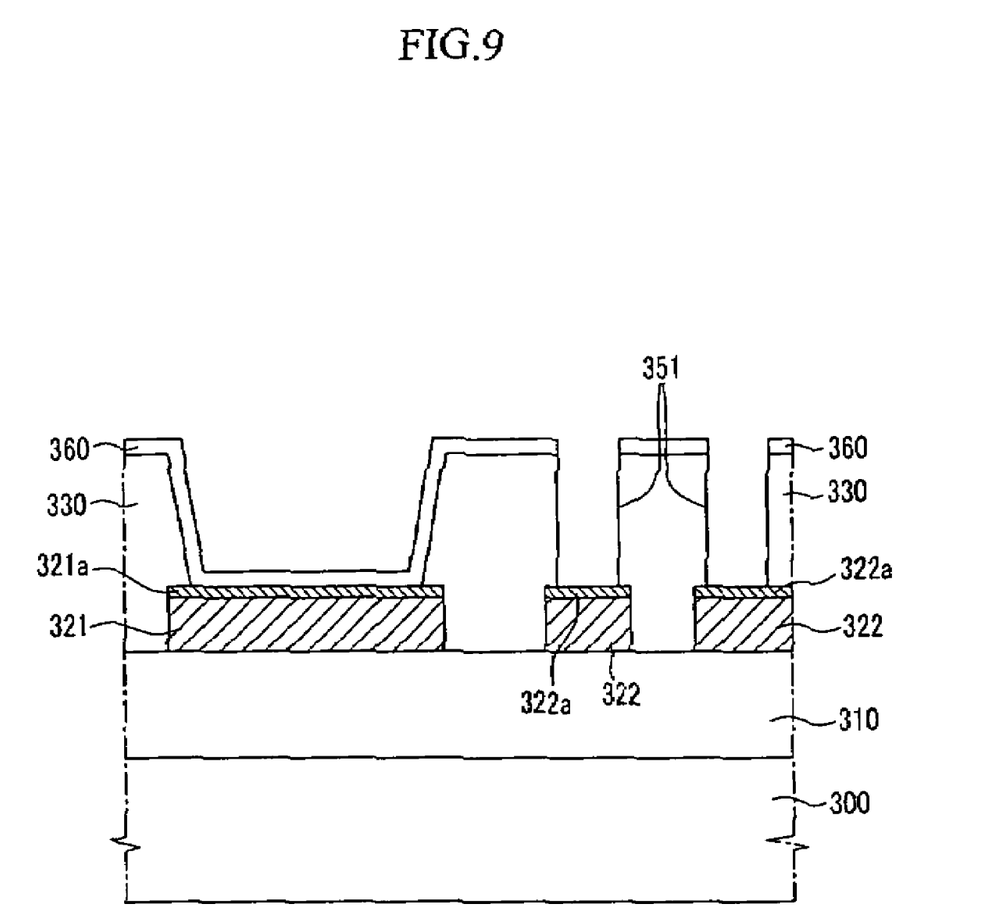

Then, referring to FIG. 9, an exposed portion of the dielectric layer 360 and a corresponding portion of the second insulating layer 330 underneath the exposed portion of the dielectric layer 360 are sequentially removed by performing an etching process using the second mask layer pattern 380 as an etching mask. Accordingly, a via hole 351 exposing the lower metal line layer pattern 322/322a is formed in the metal line region. Since the edge portion of the trench 350 is sufficiently covered by the first mask layer pattern 371 and the second mask layer pattern 380, the edge portion of the trench 350 is protected from being damaged by the etching process used to form the via hole 351. Then, the second mask layer pattern 380 and the first mask layer pattern 371 are sequentially removed. If the first mask layer pattern 371 and the second mask layer pattern 380 are photoresist layer patterns, the first mask layer pattern 371 and the second mask layer pattern 380 can be removed by performing a conventional ashing process.

Figure 10:
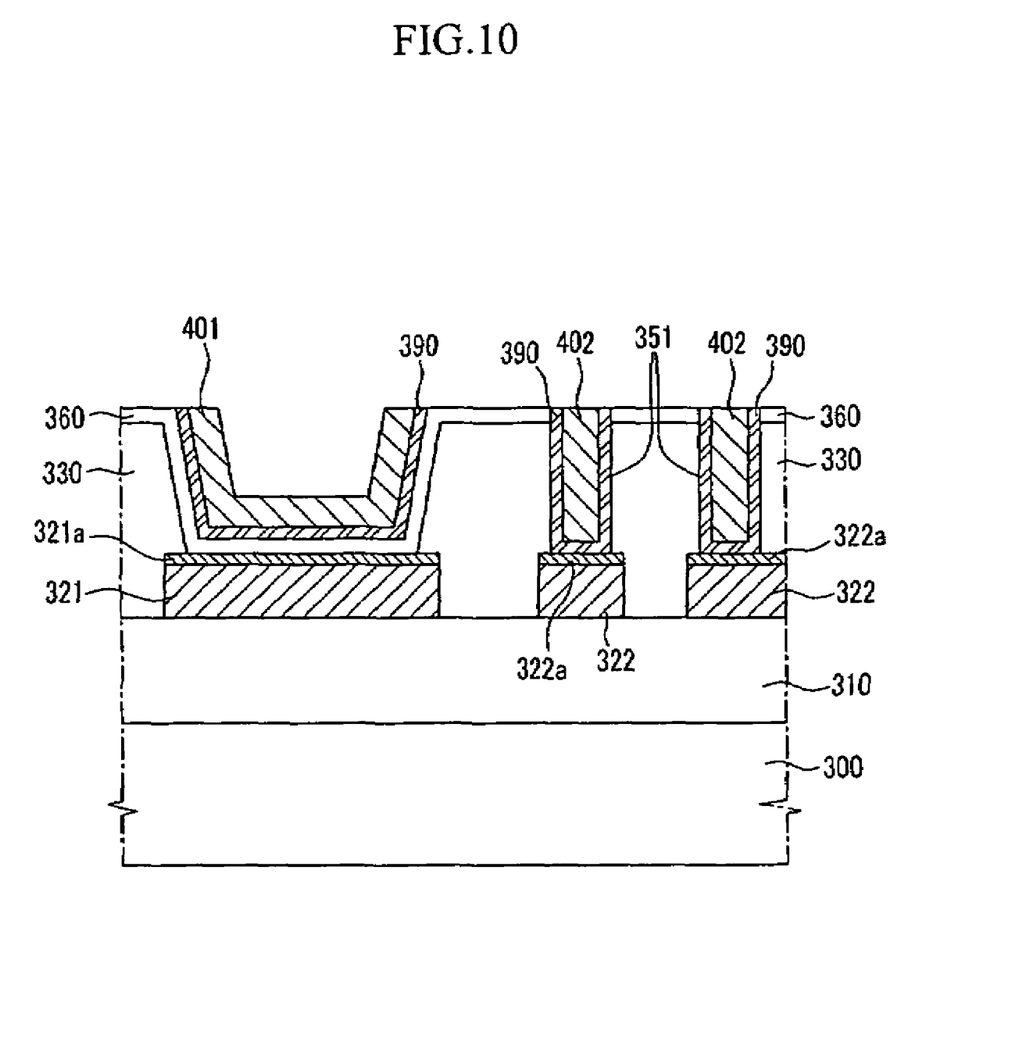

Subsequently, referring to FIG. 10, a barrier metal layer 390 and a metal layer (not shown) are formed over the entire upper surface of the structure of FIG. 9. The barrier metal layer 390 may be formed as a TiN layer or Ti/TiN layers, and the metal layer is formed as a tungsten layer. Then, a planarization process using a CMP (chemical mechanical planarization) method is performed to expose an upper surface of the dielectric layer 360. Thus, an upper metal electrode layer pattern 401 is formed on the dielectric layer 360 in the MIM capacitor forming region by interposing the barrier metal layer 390, and a via contact 402 is formed in the via hole 351 in the metal line forming region. Then, although not shown in the drawing, an upper metal line structure is formed. The upper metal line structure may be electrically connected to each of the upper metal electrode layer pattern 401 and the via contact 402.

In the example method described above, a MIM capacitor is manufactured by forming the first mask layer pattern covering the edge portion of the dielectric layer before forming the photoresist layer for forming the via hole of the metal line region. Therefore, damage to the insulating layer which could otherwise have been caused by the etching process for forming the via hole can be prevented. Accordingly, a phenomenon wherein the lower metal electrode layer pattern and the upper metal electrode layer are electrically shorted can be prevented.

From the forgoing, persons of ordinary skill in the art will appreciate that methods of manufacturing a MIM capacitor have been provided which prevent the phenomenon that a lower metal electrode layer pattern and an upper metal electrode layer are electrically shorted.

An example method of manufacturing a MIM capacitor includes: forming a lower metal electrode layer pattern for a metal-insulator-metal capacitor and a lower metal line layer pattern for a metal line on a first insulating layer on a semiconductor substrate; forming a second insulating layer covering the lower metal electrode layer pattern and the lower metal line layer pattern on the first insulating layer; forming a trench penetrating the second insulating layer and exposing the lower metal electrode layer pattern; forming a dielectric layer on the second insulating layer having the trench and an exposed surface of the lower metal electrode layer pattern; forming a first mask layer pattern on a portion of the dielectric layer within the trench and on an edge portion of the trench; forming a second mask layer pattern on the first mask layer pattern and the dielectric layer, the second mask layer pattern having an opening exposing a portion of the dielectric layer in the metal line region; forming a via hole penetrating the dielectric layer and the second insulating layer and exposing a portion of the lower metal line layer pattern using the second mask layer pattern; removing the second mask layer pattern and the first mask layer pattern; forming an upper metal electrode layer for a metal-insulator-metal capacitor on a portion of the dielectric layer within the trench, and forming a via contact connected to the lower metal line layer pattern within the via hole.

The first mask layer pattern and the second mask layer pattern may be formed using a photoresist layer.

The first mask layer pattern may have a thickness at which an edge portion of the trench is continuously covered by the first mask layer pattern during an etching process for forming the via hole.

The lower metal electrode layer pattern for the metal-insulator-metal capacitor and the lower metal line layer pattern for the metal line may be formed as Ti/Al/Ti/TiN layers or Ti/TiN/Al/TiN layers.

The method may further include forming a barrier metal layer before forming the upper metal electrode layer and the via contact.

It is noted that this patent claims priority from Korean Patent Application Serial Number 10-2004-0110632, which was filed on Dec. 22, 2004, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of manufacturing a metal-insulator-metal capacitor, comprising:

forming a lower metal electrode layer pattern for a metal-insulator-metal capacitor and a lower metal line layer pattern for a metal line on a first insulating layer on a semiconductor substrate;

forming a second insulating layer covering the lower metal electrode layer pattern and the lower metal line layer pattern on the first insulating layer;

forming a trench penetrating the second insulating layer and at least partially exposing the lower metal electrode layer pattern;

forming a dielectric layer on the second insulating layer and an exposed surface of the lower metal electrode layer pattern;

forming a first mask layer pattern on a portion of the dielectric layer within the trench and on an edge portion of the trench, using a first photoresist layer;

forming a second mask layer pattern on the first mask layer pattern and the dielectric layer using a second photoresist layer, the second mask layer pattern having an opening exposing a portion of the dielectric layer in a region corresponding to the metal line;

forming a via hole penetrating the dielectric layer and the second insulating layer and exposing at least a portion of the lower metal line layer pattern using the second mask layer pattern;

removing the second mask layer pattern and the first mask layer pattern; and forming an upper metal electrode layer for the metal-insulator-metal capacitor on a portion of the dielectric layer within the trench, and forming a via contact connected to the lower metal line layer pattern within the via hole.

2. A method as defined in claim 1, wherein the first mask layer pattern has a thickness such that an edge portion of the trench is continuously covered by the first mask layer pattern during an etching process for forming the via hole.

3. A method as defined in claim 1, wherein the lower metal electrode layer pattern for the metal-insulator-metal capacitor and the lower metal line layer pattern for the metal line comprise Al/TiN layers, Ti/Al/Ti/TiN layers or Ti/TiN/Al/TiN layers.

4. A method as defined in claim 1, further comprising forming a barrier metal layer before forming the upper metal electrode layer and the via contact.

5. A method as defined in claim 1, wherein the semiconductor substrate comprises a silicon substrate.

6. A method as defined in claim 1, wherein the lower metal electrode layer pattern for the metal-insulator-metal capacitor comprises an Al layer, a TiN layer, a Ti layer, or a combination thereof.

7. A method as defined in claim 1, wherein the first mask layer pattern comprises an opening exposing a portion of the upper surface of the second insulating layer.

8. A method as defined in claim 1, wherein the dielectric layer comprises a nitride layer.

9. A method as defined in claim 1, wherein removing the first mask layer pattern comprises performing an ashing process.

10. A method as defined in claim 9, wherein removing the second photoresist layer comprises the ashing process.

11. A method as defined in claim 1, wherein removing the second mask layer pattern and the first mask layer pattern comprises an ashing process.

12. A method as defined in claim 1, wherein the first mask layer comprises the first photoresist layer, and forming the first mask layer pattern comprises exposing and developing the first photoresist layer using photolithography.

13. A method as defined in claim 1, wherein forming the via hole comprises sequentially removing an exposed portion of the dielectric layer and a corresponding portion of the second insulating layer underneath the exposed portion of the dielectric layer by etching, using the second mask layer pattern as an etching mask.

14. A method as defined in claim 1, wherein the barrier metal layer comprises a TiN layer or a Ti/TiN layer.

15. A method as defined in claim 1, wherein the upper metal electrode layer comprises tungsten.

16. A method as defined in claim 1, further comprising, after forming the barrier metal layer, planarizing the barrier metal layer by chemical mechanical planarization.

* * * * *